United States Patent
Rim

(10) Patent No.: US 6,603,156 B2
(45) Date of Patent: Aug. 5, 2003

(54) STRAINED SILICON ON INSULATOR STRUCTURES

(75) Inventor: Kern Rim, Peekskill, NY (US)

(73) Assignee: International Business Machines Corporation, Armonk, NY (US)

(*) Notice: Subject to any disclaimer, the term of this patent is extended or adjusted under 35 U.S.C. 154(b) by 39 days.

(21) Appl. No.: 09/823,855

(22) Filed: Mar. 31, 2001

(65) Prior Publication Data

US 2002/0140031 A1 Oct. 3, 2002

(51) Int. Cl.$^7$ .................................. H01L 31/0328
(52) U.S. Cl. ................... 257/190; 257/347; 257/365
(58) Field of Search ................... 257/190, 24, 192, 257/365, 347, 217, 19, 26, 18, 752; 438/410, 439, 938, 933, 751, 753; 357/41

(56) References Cited

U.S. PATENT DOCUMENTS

| | | | |
|---|---|---|---|
| 5,006,913 A | * 4/1991 | Sugahara et al. | 357/41 |
| 5,081,062 A | * 1/1992 | Vasudev et al. | 438/412 |
| 5,240,876 A | * 8/1993 | Gaul et al. | 438/459 |
| 5,461,250 A | * 10/1995 | Burghartz et al. | 257/347 |
| 5,534,713 A | * 7/1996 | Ismail et al. | 257/24 |
| 5,659,187 A | * 8/1997 | Legoues et al. | 257/190 |
| 5,906,951 A | * 5/1999 | Chu et al. | 438/751 |
| 5,963,817 A | * 10/1999 | Chu et al. | 438/410 |
| 6,023,082 A | * 2/2000 | McKee et al. | 257/295 |
| 6,059,895 A | 5/2000 | Chu et al. | 148/33.1 |
| 6,080,235 A | * 6/2000 | McKee et al. | 117/2 |
| 6,251,738 B1 | * 6/2001 | Huang | 438/312 |
| 6,310,367 B1 | * 10/2001 | Yagishita et al. | 257/190 |
| 6,339,232 B1 | * 1/2002 | Takagi | 257/192 |
| 6,417,059 B2 | * 7/2002 | Huang | 438/312 |

OTHER PUBLICATIONS

"High Performance Strained–Si p–MOSFET on SIGe–on–Insulator Substrates Fabricated by SIMOX Technology" by T.Mizuno, S. Takagi et al. Advanced LSI Tech Lab, Toshiba Corp. 1999 IEEE 22.8.1.*

T. Mizuno, et al, *High Performance Strained–Si p–MOSFETs on SiGe–on–Insulator Substrates Fabricated by SIMOX Technology*, IEDM 934–936–99.

* cited by examiner

Primary Examiner—Carl Whitehead, Jr.
Assistant Examiner—Laura M Schillinger
(74) Attorney, Agent, or Firm—Casey P. August; Domenica N. S. Hartman; Gary M. Hartman

(57) ABSTRACT

A SOI structure and a method for its fabrication, in which a strained silicon layer lies directly on an insulator layer, contrary to the prior requirement for strained-Si layers to lie directly on a strain-inducing (e.g., SiGe) layer. The method generally entails the forming a silicon layer on a strain-inducing layer so as to form a multilayer structure, in which the strain-inducing layer has a different lattice constant than silicon so that the silicon layer is strained as a result of the lattice mismatch with the strain-inducing layer. The multilayer structure is then bonded to a substrate so that an insulating layer is between the strained silicon layer and the substrate, and so that the strained silicon layer directly contacts the insulating layer. The strain-inducing layer is then removed to expose a surface of the strained silicon layer and yield a strained silicon-on-insulator structure that comprises the substrate, the insulating layer on the substrate, and the strained silicon layer on the insulating layer. As a result, the method yields a strained silicon-on-insulator (SSOI) structure in which the strain in the silicon layer is maintained by the SOI structure.

12 Claims, 1 Drawing Sheet

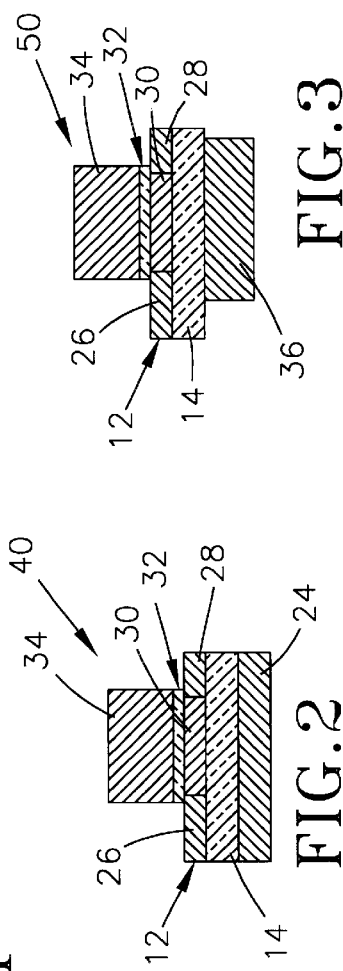
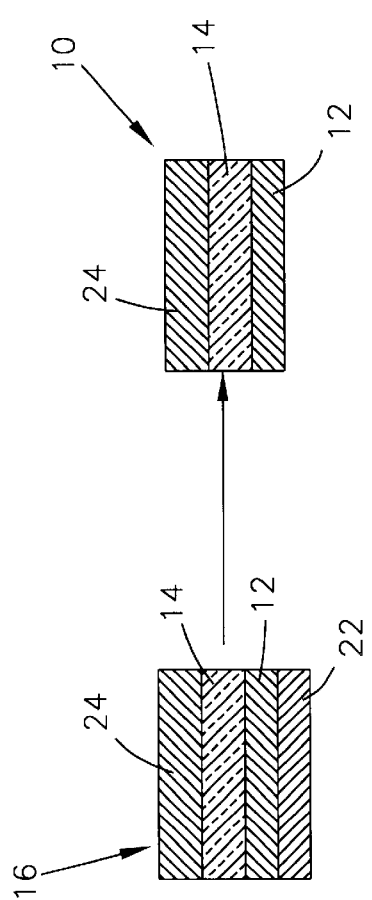
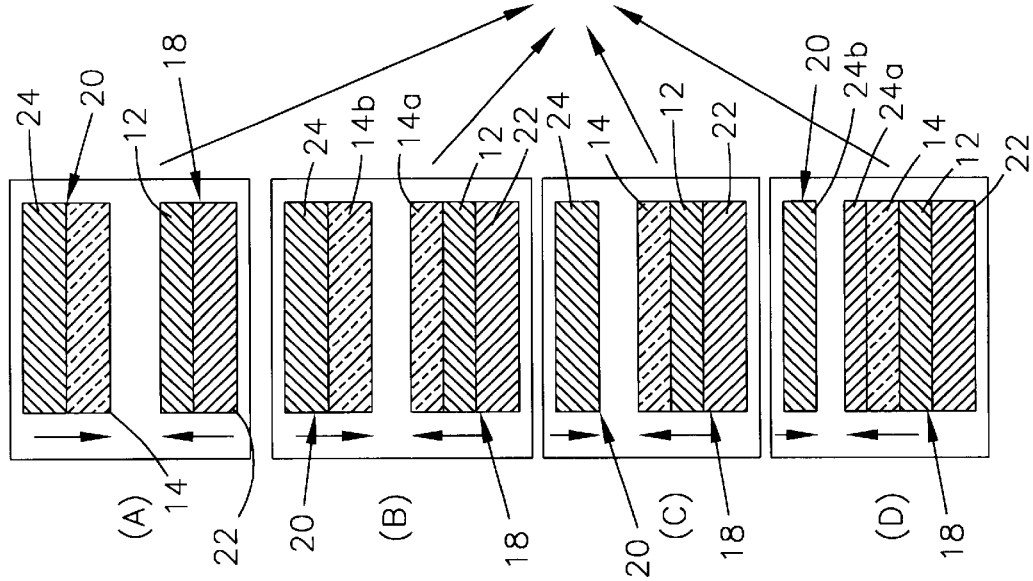

STRAINED SILICON ON INSULATOR STRUCTURES

STATEMENT REGARDING FEDERALLY SPONSORED RESEARCH

Not applicable.

BACKGROUND OF THE INVENTION

The present invention generally relates to integrated circuit (IC) structures and processes that include a strained semiconductor layer. More particularly, this invention relates to a strained silicon layer that is directly on an insulator, yielding a strained silicon-on-insulator (SSOI) structure that is useful for IC device fabrication, such as complementary metal-oxide-semiconductor (CMOS) transistors and other metal-oxide-semiconductor field effect transistor (MOSFET) applications.

Strained silicon CMOS essentially refers to CMOS devices fabricated on substrates having a thin strained silicon (strained-Si) layer on a relaxed SiGe layer. Electron and hole mobility in strained-Si layers has been shown to be significantly higher than in bulk silicon layers, and MOSFET's with strained-Si channels have been experimentally demonstrated to have enhanced device performance compared to devices fabricated in conventional (unstrained) silicon substrates. Potential performance improvements include increased device drive current and transconductance, as well as the added ability to scale the operation voltage without sacrificing circuit speed in order to reduce the power consumption.

Strained-Si layers are the result of biaxial tensile stress induced in silicon grown on a substrate formed of a material whose lattice constant is greater than that of silicon. The lattice constant of germanium is about 4.2 percent greater than that of silicon, and the lattice constant of a silicon-germanium alloy is linear with respect to its germanium concentration. As a result, the lattice constant of a SiGe alloy containing fifty atomic percent germanium is about 1.02 times greater than the lattice constant of silicon. Epitaxial growth of silicon on such a SiGe substrate will yield a silicon layer under tensile strain, with the underlying SiGe substrate being essentially unstrained, or "relaxed." A structure and process that realize the advantages of a strained-Si channel structure for MOSFET applications are taught in commonly-assigned U.S. Pat. No. 6,059,895 to Chu et al., which discloses a technique for forming a CMOS device having a strained-Si channel on a SiGe layer, all on an insulating substrate.

A difficulty in fully realizing the advantages of strained-Si CMOS technology is the presence of the relaxed SiGe layer under the strained-Si layer. The SiGe layer can interact with various processing steps, such as thermal oxidation, salicide formation and annealing, such that it is difficult to maintain material integrity during the CMOS fabrication, and may ultimately limit the device performance enhancements and device yield that can be achieved. Another disadvantage is that the SiGe layer adds to the total thickness of the body region of the MOSFET. This additional thickness is particularly undesirable for silicon-on-insulator (SOI) FET structures, because it frustrates the ability to form a very thin SOI device, whose merits as a MOSFET structure for very short channel lengths are well documented. Therefore, distinct advantages could be realized with a strained-Si structure that does not include the strain-inducing layer, but instead has a strained-Si layer that is directly on another layer, such as an insulator layer to yield a strained SOI structure. However, conventional wisdom has been that the SiGe layer must be present at all times to maintain the strain in the silicon layer, in that exposure to elevated temperatures during subsequent processing would have the effect of removing the strain in an unsupported strained-Si layer.

BRIEF SUMMARY OF THE INVENTION

The present invention provides a SOI structure and a method for its fabrication, in which a strained silicon layer lies directly on an insulator layer. As such, the invention overcomes the disadvantages of the prior art requirement for strained-Si structures on an insulating substrate to include a strain-inducing (e.g., SiGe) layer between the strained-Si layer and the insulator. The method of this invention generally entails forming a silicon layer on a strain-inducing layer so as to form a multilayer structure, in which the strain-inducing layer has a different lattice constant than silicon so that the strain-inducing layer induces strain in the silicon layer as a result of the lattice mismatch. The multilayer structure is then bonded to a substrate so that an insulating layer is between the strained silicon layer and the substrate, and so that the strained silicon layer directly contacts the insulating layer. For this purpose, the insulating layer may be provided on the substrate or on the surface of the strained silicon layer opposite the strain-inducing layer. The strain-inducing layer is then removed to yield a strained silicon-on-insulator (SSOI) structure that comprises the strained silicon layer on the insulating layer, with the insulating layer being between the substrate and strained silicon layer. As a result, the resulting SSOI structure does not include an additional strain-inducing layer. Instead, the present invention is based on the determination that strain already induced in a silicon layer can be substantially maintained by a substrate that does not have a strain-inducing lattice mismatch with silicon. In the SSOI structure, the insulating layer (alone or in combination with the substrate) is in some manner able to physically inhibit relaxation of the strained silicon layer.

According to the invention, the resulting SSOI structure is particularly well suited as a semiconductor substrate for IC devices. For this purpose, source and drain regions are formed in the surface of the strained silicon layer, and the silicon layer defines a channel between the source region and the drain region. As a result of the method by which the SSOI structure is fabricated, the strained-Si channel directly contacts the insulating layer. By eliminating the strain-inducing layer under the strained-Si channel, the present invention enables the advantages of strained-Si CMOS technology to be more fully realized. For example, eliminating the strain-inducing layer (e.g., SiGe) reduces the total thickness of the MOSFET device, and avoids interactions with various processing steps such that material integrity can be maintained during CMOS fabrication.

Other objects and advantages of this invention will be better appreciated from the following detailed description.

BRIEF DESCRIPTION OF THE DRAWINGS

FIG. 1 represents alternative techniques for forming a strained-silicon-on-insulator (SSOI) structure in accordance with the present invention.

FIGS. 2 and 3 show two MOSFET applications that utilize the SSOI structure of FIG. 1.

DETAILED DESCRIPTION OF THE INVENTION

FIG. 1 represents processes within the scope of this invention by which a multilayer structure 16 can be formed in which a strained silicon (strained-Si) layer 12 lies directly on an insulator layer 14, such that the structure 16 can be further processed to yield a strained silicon-on-insulator (SSOI) structure 10 suitable for fabrication of MOSFET's and other IC devices such as those represented in FIG. 2. FIG. 1 illustrates four alternative techniques ("Alternatives" (A), (B), (C) and (D)) for the first step of the process represented in FIG. 1. With each of the alternatives shown in FIG. 1, a multilayer structure is bonded to a substrate so that the insulator 14 is between the strained-Si layer 12 and the substrate, and such that the strained-Si layer 12 directly contacts the insulator 14. While four techniques are shown and will be discussed below, it is foreseeable that other techniques could be devised and employed to yield the intermediate multilayer structure 16 of FIG. 1, and such modifications are within the scope of this invention. In addition, while FIGS. 1 and 2 show multilayered structures comprising a limited number of layers, those skilled in the art will appreciate that additional layers of various materials could be added to the structures without substantively altering the invention. Of importance is that each technique shown in FIG. 1 produces a strained-Si layer 12 that is supported by a layer (e.g., 14/24) other than that which originally induced strain in the silicon layer 12. Therefore, additional layers can be included in the structure 16 as long as this fundamental aspect of the invention is met. The four alternatives differ primarily in the materials being bonded, e.g., silicon-to-insulator (Alternative (A)), insulator-to-insulator (Alternative (B)), insulator-to-semiconductor (Alternative (C)), or semiconductor-to-semiconductor (Alternative (D)).

Alternative (A) of FIG. 1 represents the multilayer structure 16 as being fabricated by bonding a pair of structures 18 and 20. The first structure 18 comprises the strained-Si layer 12 on a relaxed SiGe substrate 22. The function of the substrate 22 is to induce the biaxial tensile stresses that create a desired level of strain in the silicon layer 12, and therefore could be formed of another material having a lattice constant that differs from silicon. Because the relationship between the germanium concentration and lattice constant is linear for SiGe alloys, the amount of strain induced in the strained-Si layer 12 can be tailored by the amount of germanium in the SiGe alloy. Germanium has a lattice constant of about 4 percent greater than silicon, which is therefore the upper limit for the lattice mismatch between the strained-Si layer 12 and the SiGe substrate 22. A preferred lattice mismatch is believed to be about 0.2 to about 2 percent, achieved with a SiGe alloy containing about 5 to about 50 atomic percent germanium, though it is foreseeable that lower and higher mismatches could be used. Furthermore, lattice mismatches greater than 4 percent are possible of the substrate 22 is formed of a material other than a SiGe alloy.

The substrate 22 is preferably a single-crystal material, and the strained-Si layer 12 is epitaxially grown on the SiGe substrate 22 in accordance with known techniques in the art. The SiGe substrate 22 can be formed by such known methods as epitaxial growth and Czhochralski growth, though other methods are foreseeable. Because the SiGe substrate 22 has a greater lattice constant than silicon, the strained-Si layer 12 is under biaxial tension, while the underlying SiGe substrate 22 remains substantially unstrained, or "relaxed." A suitable thickness for the strained-Si layer 12 is up to about 500 angstroms, while a suitable thickness for the SiGe substrate is about 1000 to about 50,000 angstroms.

The second structure 20 of Alternative (A) of FIG. 1 comprises the insulator 14 on a substrate 24 that at least initially serves as a handle wafer for the insulator 14. As will become apparent from the following, it is foreseeable that one or more layers of various materials could be included between the insulator 14 and substrate 24 or on the backside of the substrate 24 (opposite the insulator 14). Suitable materials for the insulator 14 include silicon oxide (silica, $SiO_2$), silicon nitride (SiN), and aluminum oxide (alumina; $Al_2O_3$), though other electrical insulating ("high-k") materials could foreseeably be used, including silicon oxynitride, hafnium oxide (hafnia, $HfO_2$), zirconium oxide (zirconia, $ZrO_2$), and doped aluminum oxide. Thicknesses of up to about one micrometer are believed suitable for the insulator 14. Suitable materials for the substrate 24 are dependent on the role, if any, that the substrate 24 serves in the final SSOI structure 10. As will be discussed in greater detail below, the substrate 24 may subsequently serve as a gate electrode for a MOSFET device, such that preferred materials for the substrate 24 include single-crystal silicon, polysilicon, metals such as tungsten, etc. Other suitable materials for the substrate 24 generally include SOI, SiGe, GaAs and other III–V semiconductors. While the individual thicknesses of the insulator 14 and substrate 24 are not generally critical to the invention, the total thickness of the structure that remains to support the strained-Si layer 12 (which includes both the insulator 14 and substrate 24 in FIG. 1) must be sufficient to maintain a desired level of strain in the strained-Si layer 12.

In Alternative (A) of FIG. 1, the structures 18 and 20 are bonded together by placing the strained-Si layer 12 and insulator 14 in contact with each other, and then performing any suitable wafer bonding technique known in the art. The result of the wafer bonding technique is the multilayer structure 16 shown in FIG. 1, in which the strained-Si layer 12 is between the insulator 14 and the SiGe substrate 22, such that the insulator 14 is effectively a buried layer within the structure 16. The SiGe substrate 22 is then completely removed, preferably by a method such as chemical-mechanical polishing (CMP), wafer cleaving (such as a SmartCut process available from LETI), a chemical etching process that is selective to silicon, or a combination of these techniques. The preferred method for completely removing the SiGe substrate 22 is by a selective chemical etching process such as HHA (hydrogen peroxide, hydrofluoric acid, acetic acid) etching, which preferentially etches the SiGe substrate 22. If the SmartCut process is used, a hydrogen implant step required by this process can be performed at various points during the three process steps represented in FIG. 1. The result of removing the substrate 22 is the SSOI structure 10 shown in FIG. 1, which is shown as including only the strained-Si layer 12, the insulator 14 and the substrate 24 though, as noted above, one or more additional layers could be present between the insulator 14 and substrate 24 or on the backside of the substrate 24 (opposite the insulator 14).

Alternatives (B), (C) and (D) of FIG. 1 can make use of the same materials as used in Alternative (A). Alternative (B) differs from (A) in that the insulator 14 is formed by two individual layers 14a and 14b formed on the strained-Si layer 12 as well as the substrate 24. The layer 14a formed on the strained-Si layer 12 can be thermally grown or deposited by known methods. In Alternative (B), the bonding step is insulator-to-insulator (14a to 14b). Again, one or more additional layers could be present between the insulator layer 14b and substrate 24, or on the backside of the substrate 24 (opposite the insulator layer 14b).

Alternative (C) of FIG. 1 differs in that the insulator 14 is entirely grown or deposited directly on the strained-Si layer 12, instead of the substrate 24. As such, the substrate 24

(which may comprise multiple layers of various materials) may be the sole component of the structure 20. Alternative (C) generally represents the multilayer structure 16 as being formed by an insulator-to-semiconductor (14 to 24) bonding operation.

Similar to Alternative (C), Alternative (D) provides that the insulator 14 is grown or deposited directly on the strained-Si layer 12 instead of the substrate 24. Alternative (D) further differs by the use of two individual layers 24a and 24b to form the substrate 24, with the layer 24a being deposited on the insulator 14. The wafer bonding operation involves mating the layers 24a and 24b (the latter being shown as the sole component of the structure 20), such that after wafer bonding these layers 24a and 24b form the substrate 24. The layers 24a and 24b may be formed of the same material, e.g., one of those discussed above for the substrate 24, though applications exist where the layers 24a and 24b are preferably formed of different materials, e.g., two or more of those discussed above for the substrate 24. If the layers 24a and 24b are formed of silicon, the structures 18 and 20 can be bonded together by known silicon direct bonding methods. The layer 24a can be deposited on the insulator 14 by such known methods as chemical vapor deposition (CVD).

With each of the alternatives shown in FIG. 1, the resulting multilayer structure 16 is further processed to remove the SiGe substrate 22, leaving the SSOI structure 10. Most notably, the invention eliminates the substrate 22 that originally induced the desired tensile stress in the silicon layer 12. According to the invention, the tensile stress in the strained-Si layer 12 is maintained by the SOI structure 10, more particularly, the insulator 14 and possibly the substrate 24. The extent to which the substrate 24 contributes to maintaining the strained-Si layer 12 will depend on the particulars of the insulator 14. For example, the substrate 24 is more likely to have an affect if the insulator 14 is very thin. It is important to note that the ability for strain already induced in a silicon layer to be substantially maintained by a substrate that does not have a strain-inducing lattice mismatch with silicon was unknown until determined in an investigation leading up to this invention.

FIGS. 2 and 3 represent two SSOI MOSFET structures made possible with the present invention. In FIG. 2, a SSOI MOSFET 40 is formed by appropriately doping the strained-Si layer 12 to define source and drain regions 26 and 28 separated by a channel 30 defined by that portion of the strained-Si layer 12 between the regions 26 and 28. The source and drain regions 26 and 28 can be formed by conventional doping methods to be n+ or p+ doped. A gate structure for the channel 30 is then formed by depositing or growing a gate oxide 32, followed by a gate electrode 34, which may be metal, polysilicon, silicon, or another suitable conducting or semiconducting material. Suitable processes for forming the gate oxide 32 and electrode 34 are well known in the art, and therefore will not be discussed in any detail here. In the device of FIG. 2, the substrate 24 serves primarily as a handle wafer. In contrast, the device of FIG. 3 is a double-gate MOSFET 50, in which the substrate 24 is patterned to form a second gate electrode 36 that is insulated from the channel 30 by the insulator 14. In this role, the substrate 24 must be formed of a suitable conducting material such as tungsten or another metal, or a semiconducting material such as silicon, polysilicon, etc. As with the MOSFET 40 of FIG. 2, the double-gate MOSFET 50 of FIG. 3 can be fabricated using known MOSFET processes. Because of the greater mobility of electrons and holes in the channels 30 due to the strained-Si layers 12, each of the devices 40 and 50 of FIGS. 2 and 3 are capable of exhibiting enhanced performance as compared to conventional MOSFET devices of similar construction. Anticipated performance improvements include increased device drive current and transconductance, as well as the added ability to scale the operation voltage without sacrificing circuit speed in order to reduce power consumption.

While the invention has been described in terms of a preferred embodiment, it is apparent that other forms could be adopted by one skilled in the art. For example, different processes and process parameters could be used, the multilayer initial, intermediate and final structures could contain semiconducting and/or insulating layers in addition to those shown, and appropriate materials could be substituted for those noted. Accordingly, the scope of the invention is to be limited only by the following claims.

What is claimed is:

1. A silicon-on-insulator structure comprising a strained silicon layer directly on an insulating layer, wherein the strained silicon layer does not contact a strain-inducing layer yet is under tensile strain that was not originally induced but is maintained by the insulating layer.

2. A silicon-on-insulator structure according to claim 1, wherein the insulating layer is formed of a material chosen from the group consisting of silicon dioxide, silicon nitride, silicon oxynitride, hafnium oxide, zirconium oxide, aluminum oxide and doped aluminum oxide.

3. A silicon-on-insulator structure according to claim 1, wherein the insulating layer is a buried oxide layer between the strained silicon layer and a third layer.

4. A silicon-on-insulator structure according to claim 1, further comprising source and drain regions in the strained silicon layer, the strained silicon layer defining a channel between the source region and the drain region so as to define a field effect transistor device, the channel being in direct contact with the insulating layer.

5. A silicon-on-insulator structure according to claim 4, further comprising a gate separated from the channel by the insulating layer so that the insulating layer is a gate insulator of the field effect transistor device.

6. A silicon-on-insulator structure according to claim 4, further comprising a pair of gates separated by the channel.

7. A silicon-on-insulator structure according to claim 6, wherein a first of the gates is separated from the channel by the insulating layer so that the insulating layer is a gate insulator of the field effect transistor device.

8. A silicon-on-insulator structure according to claim 7, wherein a second of the gates is separated from the channel by a second insulating layer so that the second insulating layer is a gate insulator of a second field effect transistor device.

9. A silicon-on-insulator structure according to claim 1, further comprising a semiconductor layer contacting the insulating layer and separated from the strained silicon layer by the insulating layer.

10. A silicon-on-insulator structure comprising:
    an insulating layer;
    a strained silicon layer directly contacting the insulating layer, wherein the strained silicon layer does not contact a strain-inducing layer yet is under biaxial tension strain that was not originally induced but is maintained by the insulating layer;
    source and drain regions in the strained silicon layer, the strained silicon layer defining a channel between the source region and the drain region, the channel being in direct contact with the insulating layer;
    a gate oxide overlying the channel;

a first gate electrode contacting the gate oxide; and a second gate electrode separated from the channel by the insulating layer such that the insulating layer defines a gate insulator for the second gate electrode;

wherein the strained silicon layer does not contact a strain-inducing layer having a lattice constant different from silicon.

11. A silicon-on-insulator structure according to claim 10, wherein the insulating layer is formed of a material chosen from the group consisting of silicon dioxide, silicon nitride, silicon oxynitride, hafnium oxide, zirconium oxide, aluminum oxide and doped aluminum oxide.

12. A silicon-on-insulator structure according to claim 10, wherein the first and second gate electrodes are formed of a material chosen from the group consisting of metals, silicon and polysilicon.

* * * * *